US010115320B2

(12) United States Patent
Gauthier et al.

(10) Patent No.: US 10,115,320 B2
(45) Date of Patent: *Oct. 30, 2018

(54) METHOD AND SYSTEMS FOR UPDATING A REMOTE REPOSITORY BASED ON DATA-TYPES

(71) Applicant: CAE Inc., Saint-Laurent (CA)

(72) Inventors: Alexandre Gauthier, Saint-Laurent (CA); Michel Lagacé, Saint-Laurent (CA); Sébastien Emond, Saint-Laurent (CA)

(73) Assignee: CAE Inc., Saint-Laurent, QC (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/088,017

(22) Filed: Mar. 31, 2016

(65) Prior Publication Data

US 2017/0287358 A1    Oct. 5, 2017

(51) Int. Cl.
*G09B 19/00*    (2006.01)
*G09B 21/00*    (2006.01)
(Continued)

(52) U.S. Cl.
CPC ....... *G09B 21/00* (2013.01); *G06F 17/30241* (2013.01); *G06F 17/30345* (2013.01); *G06F 17/5009* (2013.01); *G09B 5/02* (2013.01)

(58) Field of Classification Search
CPC .......... A63B 71/00; G09B 9/00; G09B 9/003; G09B 9/006; G09B 9/02; G09B 9/04;
(Continued)

(56) References Cited

U.S. PATENT DOCUMENTS 5,240,417 A * 8/1993 Smithson ......... A63B 21/00181
348/121
5,299,810 A * 4/1994 Pierce ................... A63F 13/005
273/442
(Continued)

FOREIGN PATENT DOCUMENTS

CA    2315327    8/2000

OTHER PUBLICATIONS

International Search Report in International Application No. PCT/CA2016/000094, "Method and Systems for Updating a Remote Repository Based on Data-Types", dated Jul. 27, 2016.
(Continued)

*Primary Examiner* — Robert J Utama
(74) *Attorney, Agent, or Firm* — Gowling WLG (Canada) LLP; Benoit Yelle

(57) ABSTRACT

Method and systems, for executing an interactive computer simulation of a simulated vehicle, comprising a remote data management system, a central repository, a remote repository and an interactive computer simulation station. The central repository comprises a synthetic natural environment database (SNEDB) that comprises data of a plurality of data types for geographically-located terrain skin representations. The remote data management system maintains the remote repository storing a subset of the SNEDB. The station comprises data consumers each requiring one or more data types and sends, over the network, a data request for geographical locations from the SNEDB. The station allows users to interact in the simulation for controlling the simulated vehicle. The remote data management system determines a set of data types considering requesting data consumers and updates the subset of the SNEDB for the geographical locations with data of only the set of data types.

17 Claims, 8 Drawing Sheets

(51) Int. Cl.
*G06F 17/30* (2006.01)
*G06F 17/50* (2006.01)
*G09B 5/02* (2006.01)

(58) Field of Classification Search
CPC .......... G09B 9/042; G09B 9/048; G09B 9/30; G09B 19/167; A63F 13/00; G01C 23/005
USPC ...................................................... 434/219
See application file for complete search history.

(56) References Cited

U.S. PATENT DOCUMENTS

| | | | |
|---|---|---|---|
| 5,660,547 A * | 8/1997 | Copperman | A63F 13/10 434/29 |
| 5,910,903 A * | 6/1999 | Feinberg | G06F 11/261 700/3 |
| 6,007,338 A * | 12/1999 | DiNunzio | G09B 9/02 345/672 |
| 6,053,736 A * | 4/2000 | Huffman | F41G 7/006 342/13 |
| 6,057,847 A * | 5/2000 | Jenkins | G06T 15/20 345/422 |
| 6,057,856 A * | 5/2000 | Miyashita | G06T 15/00 345/633 |
| 6,106,297 A * | 8/2000 | Pollak | G09B 5/00 434/11 |
| 6,122,572 A * | 9/2000 | Yavnai | G05D 1/0088 342/13 |
| 6,146,143 A * | 11/2000 | Huston | G09B 9/05 345/620 |
| 6,152,856 A * | 11/2000 | Studor | A63F 13/803 434/247 |
| 6,234,799 B1 * | 5/2001 | Lin | G09B 9/08 345/952 |
| 6,558,164 B2 * | 5/2003 | Raha | G09B 9/203 434/62 |
| 6,697,731 B2 | 2/2004 | Takayama | |
| 6,766,352 B1 | 7/2004 | McBrearty et al. | |
| 6,851,094 B1 | 2/2005 | Robertson et al. | |
| 6,997,852 B2 | 2/2006 | Watterson | |
| 7,188,059 B2 * | 3/2007 | White | H04L 29/06 701/400 |
| 7,403,946 B1 | 7/2008 | Taylor | |
| 7,828,655 B2 | 11/2010 | Uhlir | |
| 8,131,667 B1 * | 3/2012 | Snider | G06F 17/30091 707/609 |
| 8,562,439 B2 | 10/2013 | Shuman | |
| 8,612,197 B1 | 12/2013 | Johnson et al. | |
| 8,616,883 B2 | 12/2013 | Wokurka | |
| 8,616,884 B1 * | 12/2013 | Lechner | G09B 9/12 434/35 |
| 8,751,204 B2 | 6/2014 | Falash et al. | |
| 9,836,990 B2 * | 12/2017 | Nguyen | G09B 9/085 |
| 2002/0053989 A1 * | 5/2002 | Lin | G01S 19/015 342/357.59 |
| 2002/0095413 A1 * | 7/2002 | Meding | G06F 17/30575 |
| 2002/0110353 A1 | 8/2002 | Potrebic | |
| 2003/0023412 A1 * | 1/2003 | Rappaport | G06Q 10/10 703/1 |
| 2003/0130973 A1 * | 7/2003 | Sumner, II | G06F 19/3437 706/45 |
| 2003/0135304 A1 * | 7/2003 | Sroub | G06Q 10/08 701/1 |
| 2003/0214530 A1 * | 11/2003 | Wang | A63F 13/08 715/757 |
| 2004/0029092 A1 | 2/2004 | Orr | |
| 2004/0236703 A1 | 11/2004 | Lemaire et al. | |
| 2005/0096933 A1 | 5/2005 | Collins, III | |
| 2005/0114144 A1 * | 5/2005 | Saylor | G09B 9/00 704/270.1 |
| 2005/0196030 A1 | 9/2005 | Schofield | |
| 2006/0183083 A1 * | 8/2006 | Moran | F41A 33/00 434/11 |
| 2007/0042868 A1 * | 2/2007 | Fisher | A63B 24/0084 482/8 |
| 2007/0113235 A1 | 5/2007 | De et al. | |
| 2007/0132777 A1 * | 6/2007 | Miyagi | A63F 13/00 345/592 |
| 2007/0218966 A1 * | 9/2007 | Tilston | A63F 13/10 463/5 |
| 2007/0264617 A1 | 11/2007 | Richardson et al. | |
| 2007/0287135 A1 * | 12/2007 | Jeon | G09B 9/04 434/29 |
| 2008/0091403 A1 | 4/2008 | Harrison et al. | |
| 2008/0103794 A1 | 5/2008 | Pettiross | |
| 2008/0158244 A1 * | 7/2008 | Hulet | G06T 15/205 345/592 |
| 2008/0180523 A1 * | 7/2008 | Stratton | G05D 1/0044 348/114 |
| 2009/0019382 A1 * | 1/2009 | Ronish | G09B 9/30 715/764 |
| 2009/0024311 A1 * | 1/2009 | Hess | G01C 23/005 701/448 |
| 2009/0220929 A1 | 9/2009 | Daniel | |
| 2010/0035726 A1 * | 2/2010 | Fisher | A63B 24/0084 482/8 |
| 2010/0250030 A1 * | 9/2010 | Nichols | G01C 23/005 701/7 |
| 2011/0171612 A1 * | 7/2011 | Gelinske | G09B 9/08 434/35 |
| 2011/0183301 A1 | 7/2011 | Turner | |
| 2011/0207091 A1 * | 8/2011 | Palmer, Jr. | G09B 9/30 434/43 |
| 2012/0088209 A1 | 4/2012 | Poole et al. | |
| 2012/0156653 A1 * | 6/2012 | Wokurka | G09B 9/16 434/30 |
| 2012/0254214 A1 | 10/2012 | Lauer et al. | |
| 2012/0293316 A1 * | 11/2012 | Johnson | E02F 9/2079 340/438 |
| 2013/0024418 A1 | 1/2013 | Sitrick et al. | |
| 2013/0318136 A1 | 11/2013 | Patel et al. | |
| 2014/0080099 A1 * | 3/2014 | Sowadski | G09B 9/54 434/37 |
| 2014/0113255 A1 | 4/2014 | Lechner et al. | |
| 2015/0072316 A1 * | 3/2015 | Hatcherson | G09B 9/301 434/30 |
| 2015/0227647 A1 * | 8/2015 | Shelton | G06F 17/5009 703/13 |
| 2016/0049003 A1 * | 2/2016 | Shuster | A63F 1/00 386/230 |
| 2016/0062689 A1 | 3/2016 | Cherubini et al. | |

OTHER PUBLICATIONS

International Search Report in International Application No. PCT/CA2016/000095, "Method and Systems for Anticipatorily Updating a Remote Repository", dated Nov. 3, 2016.

International Search Report in International Application No. PCT/CA2016/000097, "Method and Systems for Removing the Most Extraneous Data Record From a Remote Repository", dated Nov. 7, 2016.

Wang et al., "A 3D Virtual Navigation System Integrating User Positioning and Pre-Download Mechanism", World Academy of Science: Engineering and Technology 40 2008, p. 172-176.

* cited by examiner

METHOD AND SYSTEMS FOR UPDATING A REMOTE REPOSITORY BASED ON DATA-TYPES

PRIORITY STATEMENT

This non-provisional patent application claims priority based upon the PCT patent application entitled "METHOD AND SYSTEMS FOR UPDATING A REMOTE REPOSITORY BASED ON DATA-TYPES", filed on even date herewith in the name of CAE Inc., herein incorporated in its entirety.

TECHNICAL FIELD

The present invention relates to an interactive computer simulations and, more particularly, to data management during interactive computer simulations.

BACKGROUND

Interactive computer simulation systems are used to train personnel on complex and/or risky tasks. The interactive computer simulation allows a user to interact in a computer generated environment by controlling a simulated system (e.g., an aircraft, a ground vehicle, a space station, etc.). In order to provide a realistic and meaningful experience to the users of the interactive computer simulation. Simulated systems and computer environments tend to become more complex and/or are simulated in a more complex and thorough manner, which leads to an increase in the required amount of data. The amount of data required is such that an isolated computer system would have to be dimensioned unreasonably to be able to cope with it. Furthermore, when the computer generated environment needs to be modified, it is advantageous to update one or a few network locations serving many distributed simulation systems. However, when the data is distributed over a network, quality of service becomes a big challenge (e.g., network delay and limited bandwidth may affect the user experience). For instance, the behavior of a simulated airplane needs to be plausible and sufficiently predictable in the computer generated environment considering simulated conditions and commands from the user in the simulator, which requires access to a large amount of data.

The present invention addresses data management considerations in the context of interactive computer simulation systems.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with a first set of embodiments, a first aspect is directed to a remote data management system for supporting an interactive computer simulation system that executes an interactive computer simulation. The remote data management system comprises a network interface module, a data storage system and a processor module.

The network interface module provides network access towards a central repository for storing a synthetic natural environment database that comprises data for a plurality of geographically-located terrain skin representations of a computer generated environment. The network interface module also provides network access towards a plurality of interactive computer simulation stations, each one of the plurality of interactive computer simulation stations allowing one or more users to interact in the interactive computer simulation for controlling a vehicle in the computer generated environment thereof.

The data storage system comprises a remote repository accessible through the network interface module for storing a subset of the synthetic natural environment database. The remote repository is accessible to a first simulation station of the plurality of interactive simulation stations.

The processor module that computes a plurality of expected geographical positions for the first simulation station and anticipatorily updates, via the network interface module, the subset of the synthetic natural environment database stored in the remote repository with a supplemental subset of the synthetic natural environment database corresponding to one or more of the computed expected geographical positions.

Optionally, the supplemental subset of the synthetic natural environment database corresponds to geographical positions missing therefrom. The processor module may then further monitor remaining storage capacity of the remote repository and perform the anticipatory update until reaching a high-level remaining capacity threshold.

The processor module may also optionally compute the plurality of expected geographical positions by, in non-real-time priority processing, computing a training schedule for the first simulation station having one or more associated training scenarios that include the plurality of expected geographical positions.

In some embodiments, the processor module may compute the plurality of expected geographical positions by i) in real-time priority processing during execution of the interactive computer simulation, computing a vector from past update requests from the first simulation station before computing therefrom the plurality of expected geographical positions, ii) in real-time priority processing during execution of the interactive computer simulation, computing a training scenario for the interactive computer simulation that includes the plurality of expected geographical positions, iii) in real-time priority processing during execution of the interactive computer simulation, computing a vector from past update data-resolution-increase requests from the first simulation station before computing therefrom the plurality of expected geographical positions, iv) in non-real-time priority processing, computing updates to the computer generated environment at the plurality of expected geographical positions and/or v) in real-time priority processing, computing updates to the computer generated environment at the plurality of expected geographical positions.

The synthetic natural environment database may further comprise navigation content related to more than one vehicles in the computer generated environment and the processor module may then compute the plurality of expected geographical positions considering the navigation content from the perspective of the first simulation station.

The processor module may also optionally compute the plurality of expected geographical positions by further considering a subset of data types associated with a plurality of data consumers from the first simulation station. The processor module may yet also update the subset at the remote repository considering priority tags associated therewith.

In accordance with the first set of embodiments, a second aspect is directed to a method for supporting an interactive computer simulation system that executes an interactive computer simulation on a first simulation station allowing one or more users to interact in the interactive computer simulation for controlling a simulated vehicle in a computer generated environment thereof. The method comprises providing access towards a central repository comprising a synthetic natural environment database that comprises data for a plurality of geographically-located terrain skin representations of the computer generated environment of the interactive computer simulation. The method also comprises, at a remote data management system, computing a plurality of expected geographical positions for the first simulation station; and, from the remote data management system, anticipatorily updating, via the network, a subset of the synthetic natural environment database stored in a remote repository accessible to the first simulation station with a supplemental subset of the synthetic natural environment database corresponding to one or more of the computed expected geographical positions.

The method may optionally further comprise monitoring remaining storage capacity of the remote repository and the supplemental subset of the synthetic natural environment database may then correspond to geographical positions missing therefrom. Anticipatorily updating may also optionally be performed until reaching a high-level remaining capacity threshold.

The synthetic natural environment database may further comprise navigation content related to more than one vehicles in the computer generated environment and computing the plurality of expected geographical positions may then further comprise considering the navigation content from the perspective of the first simulation station.

The remote repository may also be further accessible to a second simulation station of the plurality of interactive simulation stations and computing the plurality of expected geographical positions may then be performed for the first and the second simulation stations. A proximate repository, between the remote repository and the first simulation station, may optionally be dedicated to the first simulation station and accessible to the remote repository for storing a proximate subset of the synthetic natural environment database smaller than the subset stored in the remote repository. The method may optionally further comprise, from the remote repository or from the proximate repository, computing a plurality of proximate expected geographical positions for the first simulation station and anticipatorily updating the proximate subset with a supplemental proximate subset of the synthetic natural environment database corresponding to one or more of the computed proximate expected geographical positions. The method may also further comprise executing a local interactive computer simulation application that strictly accesses the proximate repository via the network for displaying images in relation to the computer generated environment of the interactive computer simulation.

In accordance with the first set of embodiments, a second aspect is directed to a system, for executing an interactive computer simulation of a simulated vehicle, comprising a central repository, a remote data management system, a remote repository and an interactive computer simulation station interconnected via a network. The central repository comprises a synthetic natural environment database that comprises data for a plurality of geographically-located terrain skin representations of a computer generated environment of the interactive computer simulation. The remote data management system maintains the remote repository comprising a subset of the synthetic natural environment database accessible to the interactive computer simulation station. The interactive computer simulation station sends, over the network, a data request for one or more geographical locations from the synthetic natural environment database for rendering images for the interactive computer simulation and allows one or more users to interact in the interactive computer simulation for controlling the simulated vehicle in the computer generated environment considering the rendered images. The remote data management system of the interactive computer simulation system computes a plurality of expected geographical positions for the first simulation station interactive computer simulation stations and anticipatorily updates, via the network, the subset of the synthetic natural environment database stored in the remote repository with a supplemental subset of the synthetic natural environment database corresponding to one or more of the computed expected geographical positions.

The remote data management system may optionally further monitor remaining storage capacity of the remote repository and the supplemental subset of the synthetic natural environment database may then correspond to geographical positions missing therefrom. The anticipatorily update may optionally be performed until reaching a high-level remaining capacity threshold.

The system may optionally further comprise a second interactive computer simulation station having access to the remote repository via the network. The remote data management system may then compute the plurality of expected geographical positions for the interactive computer simulation station and the second interactive computer simulation station. The system may yet further comprise a proximate repository, between the remote repository and the interactive computer simulation station dedicated thereto, accessible to the remote repository for storing a proximate subset of the synthetic natural environment database smaller than the subset stored in the remote repository. The remote repository or the proximate repository may then further compute a plurality of proximate expected geographical positions for the interactive computer simulation station and anticipatorily update the proximate subset with a supplemental proximate subset of the synthetic natural environment database corresponding to one or more of the computed proximate expected geographical positions. The system may further comprise a second proximate repository, between the remote repository and the second interactive computer simulation station dedicated thereto, accessible to the remote repository for storing a second proximate subset of the synthetic natural environment database smaller than the subset stored in the remote repository. The remote repository or the second proximate repository may then further compute a plurality of second proximate expected geographical positions for the second interactive computer simulation station and anticipatorily update the second proximate subset with a second supplemental proximate subset of the synthetic natural environment database corresponding to one or more of the computed second proximate expected geographical positions.

The proximate repository and the second proximate repository may optionally strictly access the remote repository via the network for respectively complementing the proximate subset and the second proximate subset and the remote repository may strictly access the central repository for complementing the subset.

In accordance with a second set of embodiments, a first aspect is directed to a remote data management system for supporting an interactive computer simulation system that executes an interactive computer simulation. The remote data management system comprises a network interface module, a data storage system and a processor module.

The network interface module provides network access towards a central repository for storing a synthetic natural environment database that comprises data of a plurality of data types for a plurality of geographically-located terrain skin representations of a computer generated environment of the interactive computer simulation. The network interface module also provides network access towards an interactive computer simulation station participating in the interactive computer simulation. The computer simulation stations allow one or more users to interact in the interactive computer simulation for controlling a vehicle in the computer generated environment, wherein the interactive computer simulation station comprising a plurality of data consumers each requiring data from one or more of the plurality of data types.

The data storage system comprises a remote repository for storing a subset of the synthetic natural environment database.

The processor module, upon receipt of a data request from the interactive computer simulation station for one or more geographical locations, determines a set of data types considering one or more requesting data consumers from the plurality of data consumers and updates the subset of the synthetic natural environment database in the remote repository for the one or more geographical locations with data of only the set of data types.

Optionally, the plurality of data types may comprise rendering-faces data, surface-texture data and reflectivity data. The plurality of data consumers may comprise a radar system requiring rendering faces data and reflectivity data and a visual display system requiring rendering faces data and surface texture data.

The set of data types may optionally be determined by a logical union operation of required data types from the one or more requesting data consumers.

Optionally, the processor module may compute a plurality of expected geographical positions for the interactive computer simulation station and monitor remaining storage capacity of the remote repository. Updating the subset may then be performed for one or more of the expected geographical positions until reaching a high-level remaining capacity threshold.

The synthetic natural environment database may further comprise navigation content related to more than one vehicles in the computer generated environment and the processor module may then determine the set of data types considering the navigation content from the perspective of the interactive computer simulation station.

The processor module may optionally update the subset at the remote repository considering priority tags associated therewith.

In accordance with the second set of embodiments, a second aspect is directed to a method for supporting an interactive computer simulation system that executes an interactive computer simulation. The method comprises providing access towards a central repository that stores a synthetic natural environment database that comprises data of a plurality of data types for a plurality of geographically-located terrain skin representations of a computer generated environment of the interactive computer simulation and receiving, over a network, a data request issued from an interactive computer simulation station for one or more geographical locations. The interactive computer simulation station allows one or more users to interact in the interactive computer simulation for controlling a vehicle in the computer generated environment. The interactive computer simulation station comprises a plurality of data consumers each requiring data from one or more of the plurality of data types. The method also comprises determining a set of data types considering one or more requesting data consumers from the plurality of data consumers and updating, over the network, a subset of the synthetic natural environment database stored in a remote repository for the one or more geographical locations with data of only the set of data types. The remote repository is accessible to the interactive computer simulation station.

Optionally, the plurality of data types may comprise rendering-faces data, surface-texture data and reflectivity data. The plurality of data consumers may further comprise a radar system requiring rendering faces data and reflectivity data and a visual display system requiring rendering faces data and surface texture data.

Determining the set of data types may optionally be performed by a logical union operation of required data types from the one or more requesting data consumers.

The method may further comprise computing a plurality of expected geographical positions for the interactive computer simulation station and monitoring remaining storage capacity of the remote repository. Updating the subset may then be performed for one or more of the expected geographical positions until reaching a high-level remaining capacity threshold.

The synthetic natural environment database may optionally further comprise navigation content related to more than one vehicles in the computer generated environment and determining the set of data types may then be performed considering the navigation content from the perspective of the interactive computer simulation station.

Updating the subset at the remote repository may optionally be performed considering priority tags associated therewith.

In accordance with the second set of embodiments, a third aspect is directed to a system, for executing an interactive computer simulation of a simulated vehicle, comprising a central data management system, a central repository, a remote repository and an interactive computer simulation station interconnected via a network. The central repository comprises a synthetic natural environment database that comprises data of a plurality of data types for representing a plurality of geographically-located terrain skin representations of a computer generated environment of the interactive computer simulation.

The remote data management system of the interactive computer simulation system maintain the remote repository storing a subset of the synthetic natural environment database.

The interactive computer simulation station comprises a plurality of data consumers each requiring data from one or more of the plurality of data types, sends, over the network, a data request for one or more geographical locations from the synthetic natural environment database for rendering images for the interactive computer simulation and allows one or more users to interact in the interactive computer simulation for controlling the simulated vehicle in the computer generated environment considering the rendered images The remote data management system of the interactive computer simulation system determines a set of data types considering one or more requesting data consumers from the data request and updates, over the network, the subset of the synthetic natural environment database stored in the remote repository for the one or more geographical locations with data of only the set of data types.

The remote data management system of the interactive computer simulation system may further compute a plurality of expected geographical positions for the interactive computer simulation station, monitor remaining storage capacity of the remote repository and update the subset in the remote repository for one or more of the expected geographical positions until reaching a high-level remaining capacity threshold.

The system may optionally further comprise a second interactive computer simulation station having access to the remote repository via the network. The remote data management system may then determine the set of data types considering one or more requesting data consumers from the plurality of data consumers and one or more second requesting data consumers from a second plurality of data consumers of the second interactive computer simulation station.

The system may further optionally comprise a proximate repository, between the remote repository and the interactive computer simulation station dedicated thereto, accessible to the remote repository for storing a proximate subset of the synthetic natural environment database smaller than the subset stored in the remote repository. The remote repository or the proximate repository may further determine a set of proximate data types considering one or more requesting data consumers from the plurality of data consumers and remotely updates, over the network, the proximate subset of the synthetic natural environment database stored in the proximate repository for the one or more geographical locations with data of only the set of data types.

Optionally, the system may also further comprise a second proximate repository, between the remote repository and the second interactive computer simulation station dedicated thereto, accessible to the remote repository for storing a second proximate subset of the synthetic natural environment database smaller than the subset stored in the remote repository. The remote repository or the second repository may then further determine a second set of proximate data types considering the one or more second requesting data consumers from the second plurality of data consumers and remotely update, over the network, the second proximate subset of the synthetic natural environment database stored in the second proximate repository for the one or more geographical locations with data of only the second set of data types.

The proximate repository and the second proximate repository may optionally strictly access the remote repository via the network for respectively complementing the proximate subset and the second proximate subset and the remote repository may likewise strictly access the central repository for complementing the subset.

In accordance with a third set of embodiments, a first aspect is directed to a remote data management system for supporting an interactive computer simulation system that executes an interactive computer simulation. The remote data management system comprises network interface module, data storage system and a processor module.

The central repository is for storing a synthetic natural environment database that comprises a plurality of data records for a plurality of geographically-located terrain skin representations of the computer generated environment. The network interface module also provides network access towards a plurality of interactive computer simulation stations, each one of the plurality of interactive computer simulation stations allowing one or more users to interact in the interactive computer simulation for controlling a vehicle in the computer generated environment thereof.

The data storage system comprises a remote repository accessible through the network interface module for storing a subset of data records from the synthetic natural environment database. One of a plurality of priority tags is associated with each one of the subset of data records and the remote repository is accessible to the plurality of interactive simulation stations.

The processor module monitors remaining storage capacity of the remote repository and, upon reaching a high-level threshold value for the remaining storage capacity, removes, via the network interface module, the most extraneous data record, identified considering one or more of the plurality of priority tags, from the subset of data records stored in the remote repository until reaching a low-level threshold value for the remaining storage capacity.

The processor module may optionally identify the most extraneous data record as a top data record from a priority-ordered target list for the subset of data records in the remote repository considering the plurality of priority tags. Removing the most extraneous data record may then be performed by removing the top data record from the target list until reaching a low-level threshold value for the remaining storage capacity. Each one of the plurality of priority tags may comprise a time-based indication for obtaining a corresponding relative record age and a record-insertion-method indication. The record-insertion-method indication may be considered before considering the time-based indication for ordering the target list. The record-insertion-method indication may be one of "requested from simulation" and "predicted from repository", and the target list may order all the "predicted from repository" records at the top followed by all the "requested from simulation" records by age with the oldest towards the top. The "predicted from repository" indication may further orderly contain "geographic predicted", "sub-data-type" and "best-guess" indications.

Each one of the plurality of priority tags may further comprise a "number of requestors" indication considered before the time-based indication for ordering the target list.

In accordance with the third set of embodiments, a second aspect is directed to a method for supporting an interactive computer simulation system that executes an interactive computer simulation. The method comprises providing access towards a central repository that stores a synthetic natural environment database that comprises a plurality of data records for a plurality of geographically-located terrain skin representations of a computer generated environment. The method also comprises maintaining a remote repository accessible through a network for storing a subset of data records from the synthetic natural environment database. Each one of a plurality of priority tags is associated with each one of the subset of data records. The remote repository is accessible through the network to a plurality of interactive computer simulation stations, each one of the plurality of interactive computer simulation stations allowing one or more users to interact in the interactive computer simulation for controlling a vehicle in the computer generated environment thereof.

The method also comprises monitoring remaining storage capacity of the remote repository and, upon reaching a high-level threshold value for the remaining storage capacity, removing, via the network, the most extraneous data record, identified considering one or more of the plurality of priority tags, from the subset of data records stored in the remote repository until reaching a low-level threshold value for the remaining storage capacity.

The method may further comprise identifying the most extraneous data record as a top data record from a priority-ordered target list for the subset of data records in the remote repository considering the plurality of priority tags. Removing the most extraneous data record may then be performed by removing the top data record from the target list until reaching a low-level threshold value for the remaining storage capacity.

Optionally, each one of the plurality of priority tags may comprise a time-based indication for obtaining a corresponding relative record age and a record-insertion-method indication. The record-insertion-method indication may then be considered before considering the time-based indication for ordering the target list. The record-insertion-method indication may be one of "requested from simulation" and "predicted from repository", and the target list may order all the "predicted from repository" records at the top followed by all the "requested from simulation" records by age with the oldest towards the top. The "predicted from repository" indication may further orderly contain "geographic predicted", "sub-data-type" and "best-guess".

Optionally, each one of the plurality of priority tags may further comprise a "number of requestors" indication considered before the time-based indication for ordering the target list.

In accordance with the third set of embodiments, a third aspect is directed to a system, for executing an interactive computer simulation of a simulated vehicle, comprising a central data management system, a central repository, a remote repository and an interactive computer simulation station interconnected via a network.

The central repository stores a synthetic natural environment database that comprises a plurality of data records for a plurality of geographically-located terrain skin representations of a computer generated environment.

The remote data management system of the interactive computer simulation system maintains the remote repository storing a subset of data records from the synthetic natural environment database. Each one of a plurality of priority tags is associated with each one of the subset of data records.

The interactive computer simulation station sends, over the network, a data request for one or more geographical locations from the synthetic natural environment database for rendering images for the interactive computer simulation and allows one or more users to interact in the interactive computer simulation for controlling the simulated vehicle in the computer generated environment considering the rendered images.

The remote data management system of the interactive computer simulation system monitors remaining storage capacity of the remote repository and, upon reaching a high-level threshold value for the remaining storage capacity, removes, via the network, the most extraneous data record, identified considering one or more of the plurality of priority tags, from the subset of data records stored in the remote repository until reaching a low-level threshold value for the remaining storage capacity.

The most extraneous data record may optionally be identified as the top data record from a priority-ordered target list for the subset of data records in the remote repository considering the plurality of priority tags and the most extraneous data record may then be removed by removing the top data record from the target list until reaching a low-level threshold value for the remaining storage capacity. Each one of the plurality of priority tags may further comprise a time-based indication for obtaining a corresponding relative record age and a record-insertion-method indication and the record-insertion-method indication may then be considered before considering the time-based indication for ordering the target list. The record-insertion-method indication may further be one of "requested from simulation" and "predicted from repository", and wherein the target list orders all the "predicted from repository" records at the top followed by all the "requested from simulation" records by age with the oldest towards the top.

The system may further optionally comprise a second interactive computer simulation station having access to the remote repository via the network. Each one of the plurality of priority tags may then further comprise a "number of requestors" indication considered before the time-based indication for ordering the target list.

The system may also optionally comprise a proximate repository, between the remote repository and the interactive computer simulation station dedicated thereto, accessible to the remote repository for storing a proximate subset of the synthetic natural environment database smaller than the subset stored in the remote repository. The remote repository or the proximate repository may further monitor proximate remaining storage capacity of the proximate repository and, upon reaching a high-level threshold value for the proximate remaining storage capacity, remove (remotely or locally), via the network, the most extraneous data record, identified considering one or more of the plurality of priority tags, from the proximate subset of data records stored in the proximate repository until reaching a low-level threshold value for the proximate remaining storage capacity.

The system may yet further comprise a second proximate repository, between the remote repository and the second interactive computer simulation station dedicated thereto, accessible to the remote repository for storing a second proximate subset of the synthetic natural environment database smaller than the subset stored in the remote repository. The remote repository or the second proximate repository may then further monitor second proximate remaining storage capacity of the second proximate repository and, upon reaching a high-level threshold value for the second proximate remaining storage capacity, remove (remotely or locally), via the network, the most extraneous data record, identified considering one or more of the plurality of priority tags, from the second proximate subset of data records stored in the second proximate repository until reaching a low-level threshold value for the second proximate remaining storage capacity.

The proximate repository and the second proximate repository may optionally strictly access the remote repository via the network for respectively complementing the proximate subset and the second proximate subset and the remote repository strictly may likewise access the central repository for complementing the subset.

BRIEF DESCRIPTION OF THE DRAWINGS

Further features and exemplary advantages of the present invention will become apparent from the following detailed description, taken in conjunction with the appended drawings, in which.

DETAILED DESCRIPTION

Figure 1:
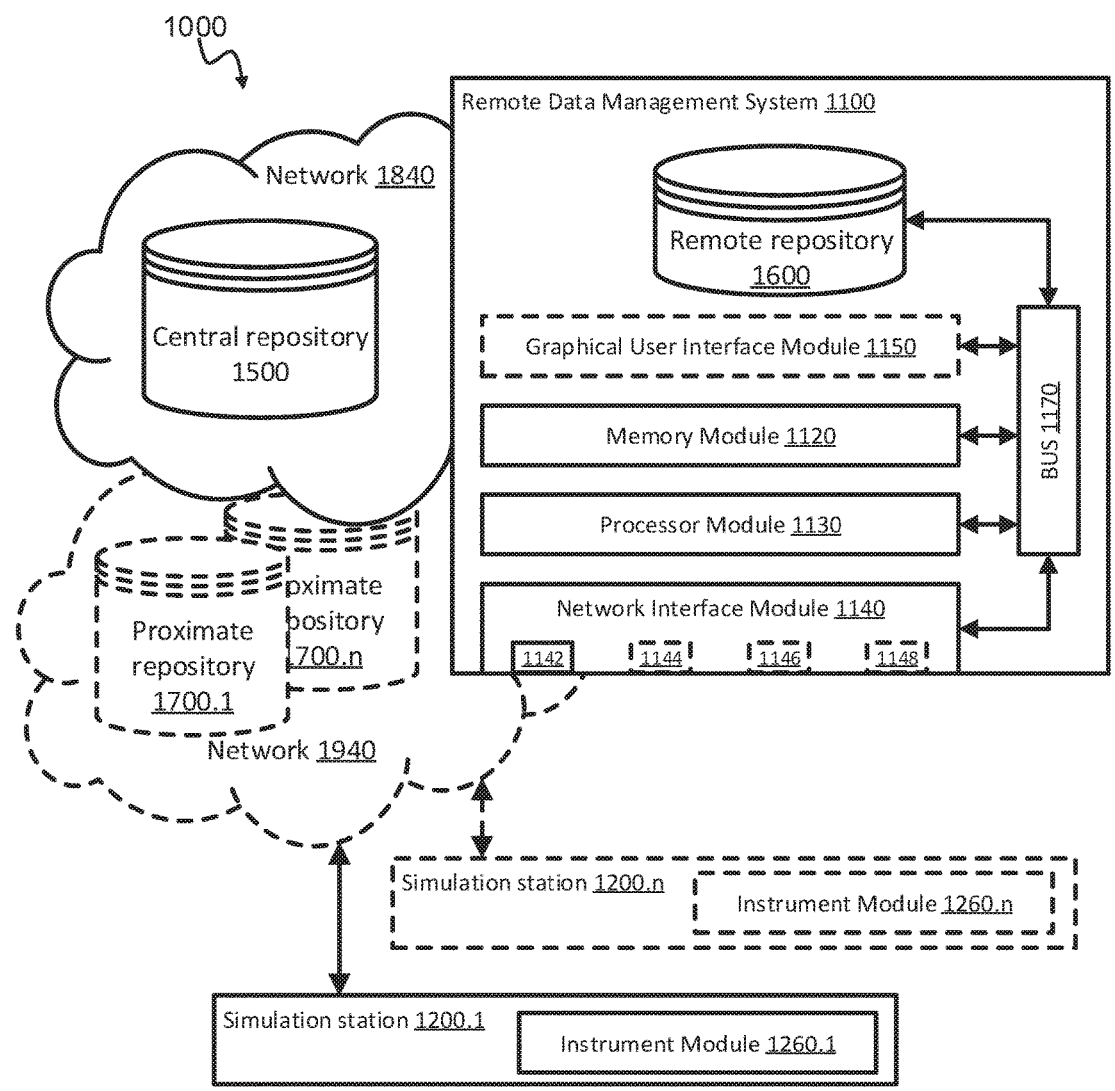
FIG. 1 is a first logical representation of an exemplary computer system in accordance with the teachings of the present invention.

Reference is now made to the drawings in which FIG. 1 shows a logical modular view of an exemplary interactive computer simulation system 1000 in accordance with the teachings of the present invention. The interactive computer simulation system 1000 performs one or more interactive computer simulations. Each interactive computer simulation comprises one or more simulated systems such as simulated vehicles (simulated aircrafts, simulated tanks or ground vehicles, simulated marine vessel, etc.). In the depicted embodiment of FIG. 1, the interactive computer simulation system 1000 comprises a remote data management system 1100 for supporting the interactive computer simulation system 1000 when executing the interactive computer simulation(s). The interactive computer simulation system 1000 typically comprises at least one simulation station 1200.1, but typically comprises a plurality of simulation stations 1200.1 . . . 1200.*n*. The plurality of simulation stations is referred to together as the simulation stations 1200 hereinafter. Each of the plurality of simulation stations 1200 allows one or more users to interact to control a simulated system in a computer generated environment of the interactive computer simulation system 1000. The remote data management system 1100 and the simulation stations 1200 are depicted as being interconnected via a network 1940. The network 1940 may be connected or may provide access to a network 1840. Skilled persons will readily understand that the direct connections or a mix of direct and network connections may be used to interconnect the remote data management system 1100 and the simulation stations 1200. Various network links may be implicitly or explicitly used in the context of the present invention. While a link may be depicted as a wired link (using a coaxial cable, an optical fiber, a category 5 cable, and the like), it could also be embodied as a wireless link (using a cellular link, a wireless LAN, and the like). A wired or wireless access point (not shown) may be present on links. Likewise, any number of routers and/or switches (not shown) may be present on links, which may further transit through the Internet.

In the depicted example of FIG. 1, the remote data management system 1100 comprises a memory module 1120, a processor module 1130 and a network interface module 1140. The processor module 1130 may represent a single processor with one or more processor cores or an array of processors, each comprising one or more processor cores. The memory module 1120 may comprise various types of memory (different standardized or kinds of Random Access Memory (RAM) modules, memory cards, Read-Only Memory (ROM) modules, programmable ROM, etc.). The network interface module 1140 represents at least one physical interface that can be used to communicate with other network nodes. The network interface module 1140 may be made visible to the other modules of the computer system 1100 through one or more logical interfaces. The actual stacks of protocols used by the physical network interface(s) and/or logical network interface(s) 1142, 1144, 1146, 1148 of the network interface module 1140 do not affect the teachings of the present invention. The variants of processor module 1130, memory module 1120 and network interface module 1140 usable in the context of the present invention will be readily apparent to persons skilled in the art.

A bus 1170 is depicted as an example of means for exchanging data between the different modules of the remote data management system 1100. The present invention is not affected by the way the different modules exchange information between them. For instance, the memory module 1120 and the processor module 1130 could be connected by a parallel bus, but could also be connected by a serial connection or involve an intermediate module (not shown) without affecting the teachings of the present invention.

Likewise, even though explicit mentions of the memory module 1120 and/or the processor module 1130 are not made throughout the description of the various embodiments, persons skilled in the art will readily recognize that such modules are used in conjunction with other modules of the remote data management system 1100 to perform routine as well as innovative steps related to the present invention.

A distributed data storage system is also provided in the interactive computer simulation system 1000. In the example of FIG. 1, a central repository 1500 stored a synthetic natural environment database that comprises data for representing geographically-located terrain skin of the computer generated environment. For instance, the terrain skin representation would typically comprise material data and/or imagery data and/or elevation data for different areas of the terrain (e.g., a portion of the terrain identified by a geographical position has certain properties. The synthetic natural environment database may also further comprise geographically-located 3D polygon mesh data (buildings and structure of the computer generated environment) as well as vector data and metadata (e.g., default values on common element). The central repository 1500 may also log dynamic data in relation to the different simulated systems while the interactive computer simulation is performed (e.g., weather-related (such as clouds), modifications made by the simulated system on the computer generated environment, etc.). The remote data management system 1100 comprises a remote repository 1600 for storing a subset of the synthetic natural environment database. The central repository 1500 is accessible by the remote data management system 1100 through the network interface module 1140. The remote repository 1600 is also accessible to the simulation stations 1200 through the network 1940.

In some embodiments, each of the simulation stations 1200.1 . . . 1200.*n* are further connected to a proximate repository 1700.1 . . . 1700.*n* (referred to together as the proximate repositories 1700). The proximate repositories 1700 may thus each serve a small number of the simulation stations 1200. In some embodiments (as depicted), each of the proximate repositories is dedicated to a single of the simulation stations. The distributed data storage system may thus support a hierarchical configuration when the proximate repositories are provided. The proximate repositories 1700 are accessible by the remote repository 1600 through the network 1940. The proximate repositories 1700 are also accessible to the simulation stations 1200 through the network 1940. In embodiments where proximate repositories are provided, each of the proximate repositories 1700 store their own proximate subset of the synthetic natural environment database that are each fully encompassed in the subset stored at the remote repository 1600.

FIG. 1 shows the remote repository 1600 as a database integrated with the remote data management system 1100 while the central repository 1500 and the optional proximate repositories 1700 are depicted as standalone databases. Skilled persons will acknowledge that different data storage configurations may be provided (standalone database system, a distinct module of a system or a sub-module of a memory module). The distributed data storage system does not necessarily comprise repositories implemented using a single configuration or, conversely, mutual exclusive configurations. The distributed data storage system may comprise one or more logical or physical as well as local or remote hard disk drive (HDD) (or an array thereof). The distributed data storage system may further comprise a local or remote database made accessible to the remote data management system 1100 and/or the simulation stations 1200 by a standardized or proprietary interface or via the network 1840/1940. The configuration variants of distributed data storage system usable in the context of the present invention will be readily apparent to persons skilled in the art.

Users of the interactive computer simulation system 1000 (e.g., users of the simulation stations 1200) interact in the interactive computer simulation to control a simulated system in a computer generated environment of the interactive computer simulation system 1000 (e.g., instructors or experts, trainees such as a pilot and co-pilot, a driver, an operator, a surgeon, etc.). Examples of simulated system include an aircraft, a ground vehicle, a marine vessel, a spacecraft or space station, a control room, a patient, etc.

The remote data management system 1100 may comprises a graphical user interface module 1150 for performing various management tasks on the remote data management system 1100. However, as the remote data management system 1100 is mainly accessible remotely, the management tasks are also typically handled remotely.

The simulation stations 1200.1 . . . 1200.n each comprise a tangible instrument module 1260.1 . . . 1260.n (referred to together as the tangible instrument modules 1260). The tangible instrument modules 1260 each provide one or more tangible instrument to the user of the simulation stations for controlling the simulated system in the interactive computer simulation(s). Different tangible instruments are provided depending on the system being simulated. In the example of the aircraft, typical tangible instruments include various switches, levers, pedals and the like accessible to the user for controlling the aircraft in the computer generated environment of the interactive computer simulation(s). Depending on the type of interactive simulation (e.g., level of immersivity), the tangible instruments may be more or less realistic compared to an actual aircraft. While the present invention is applicable to immersive flat simulators certified for commercial training, skilled persons will readily recognize and be able to apply its teachings to other types of computer simulations.

Figure 2:
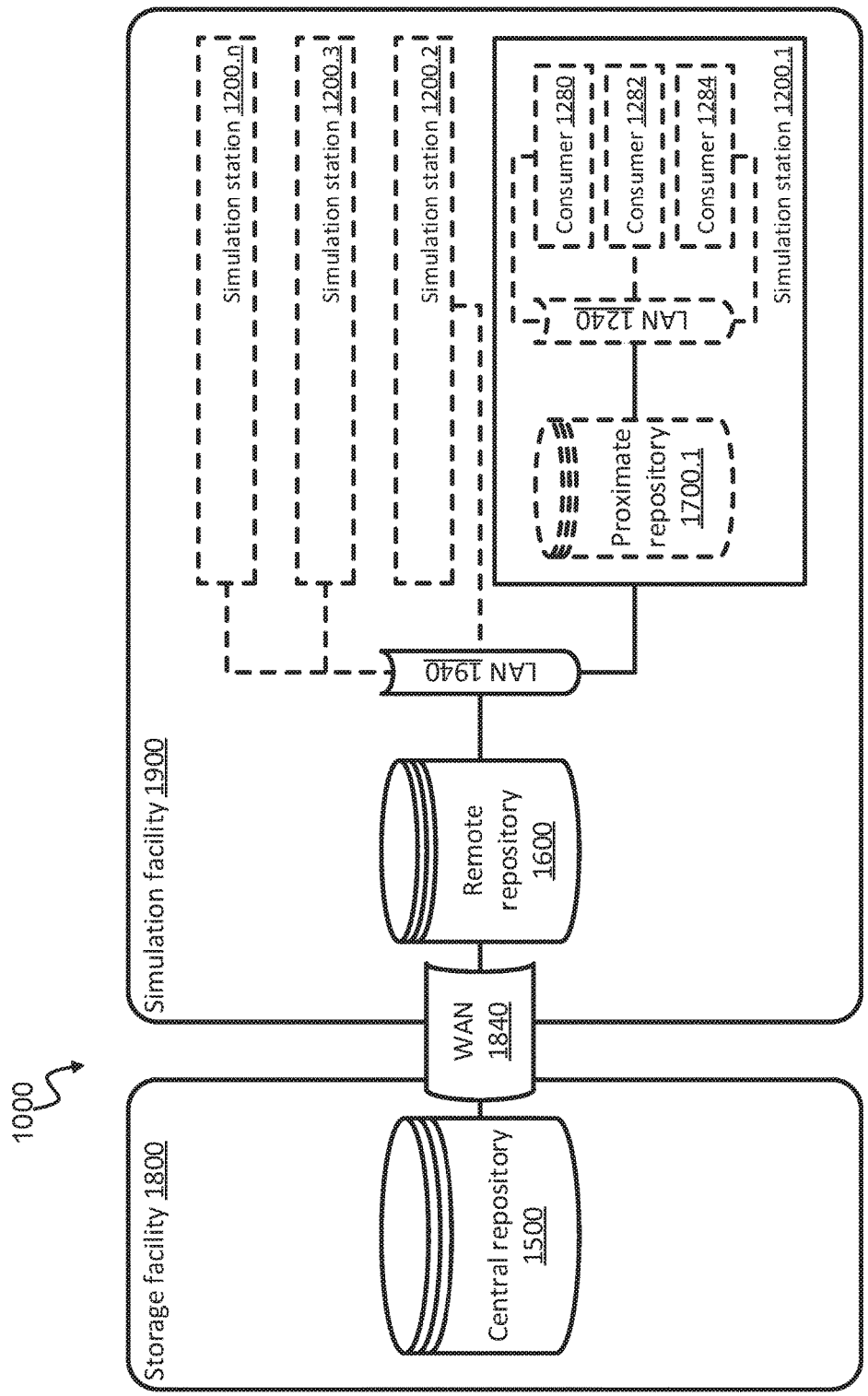
FIG. 2 is a second logical representation of the exemplary computer system in accordance with the teachings of the present invention.
Figure 3A:
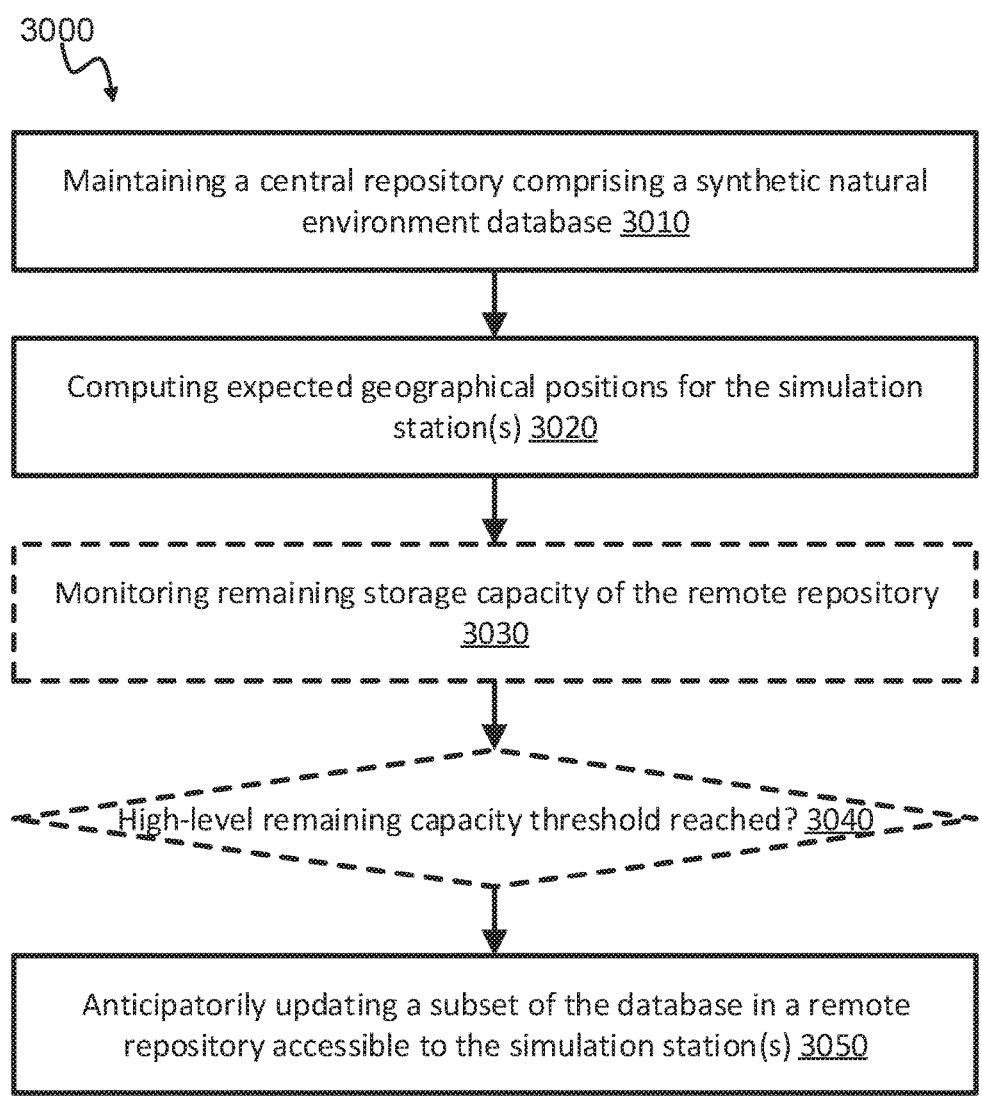
FIG. 3A, FIG. 3B, FIG. 4A, FIG. 4B, FIG. 5A and FIG. 5B are flow charts of exemplary methods in accordance with the teachings of the present invention.
Figure 3B:
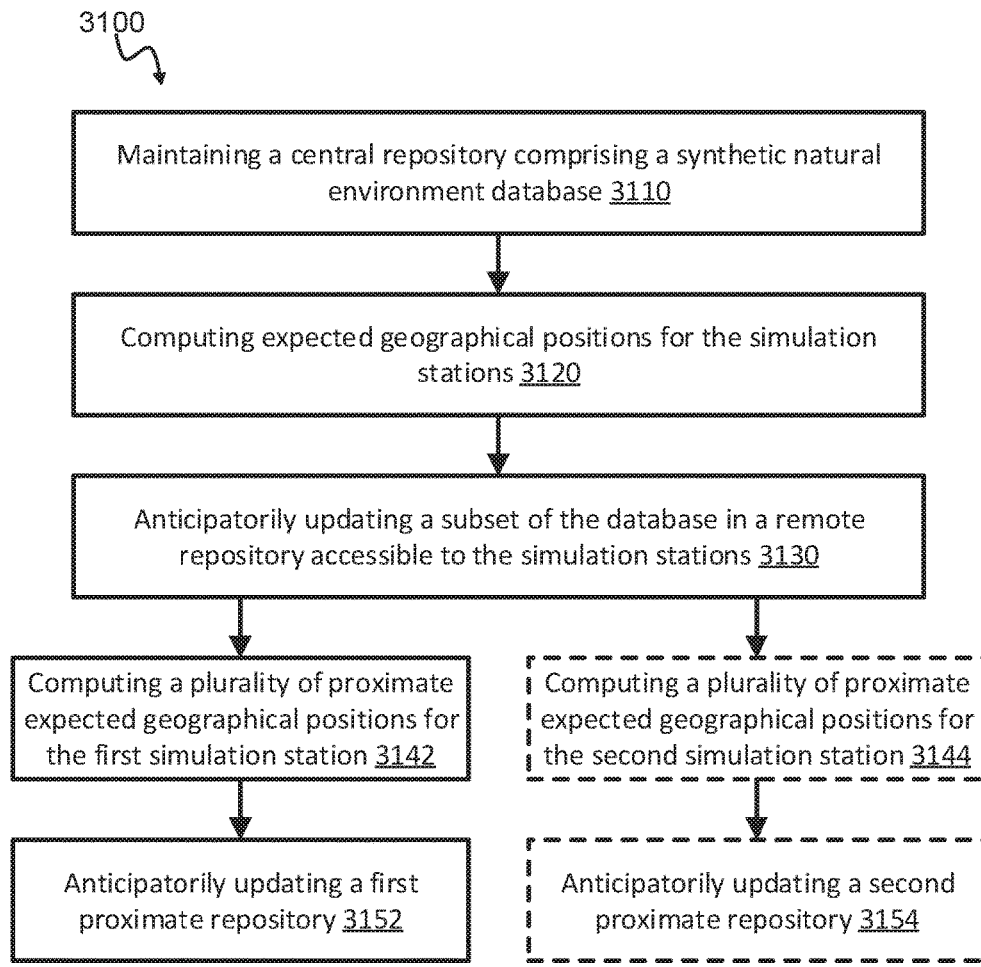
Figure 4A:
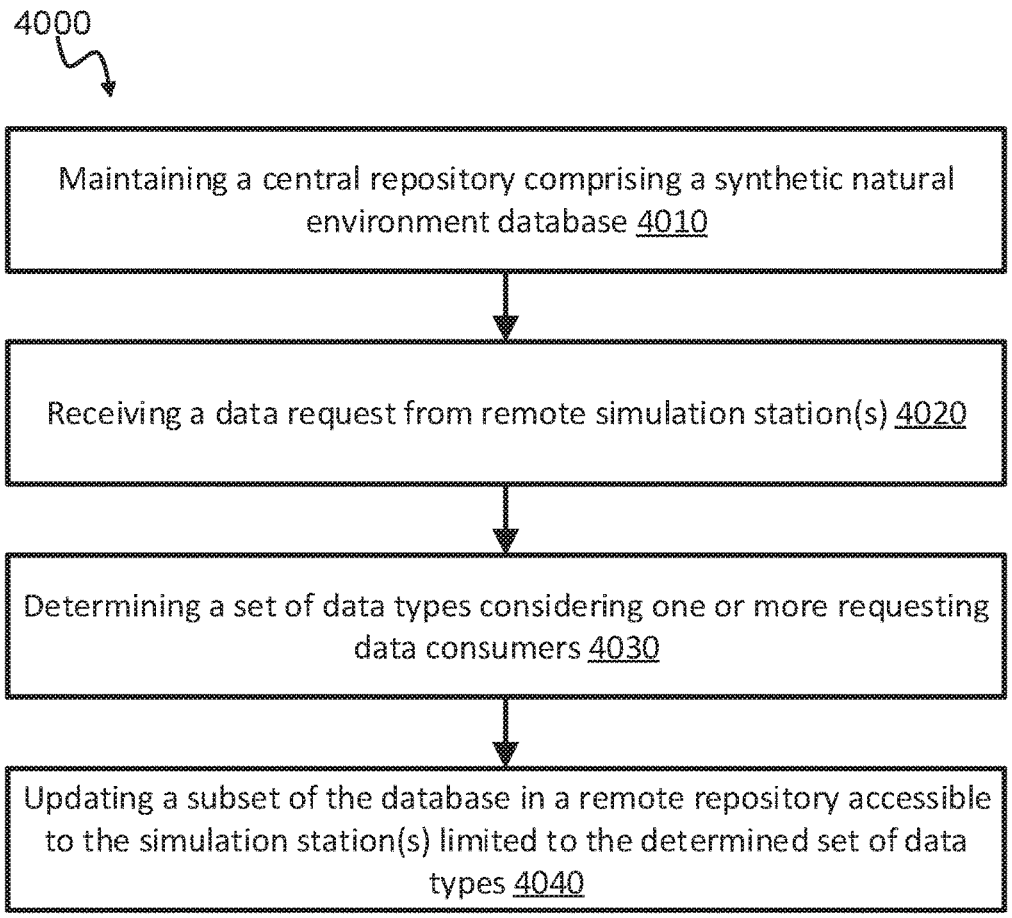
Figure 4B:
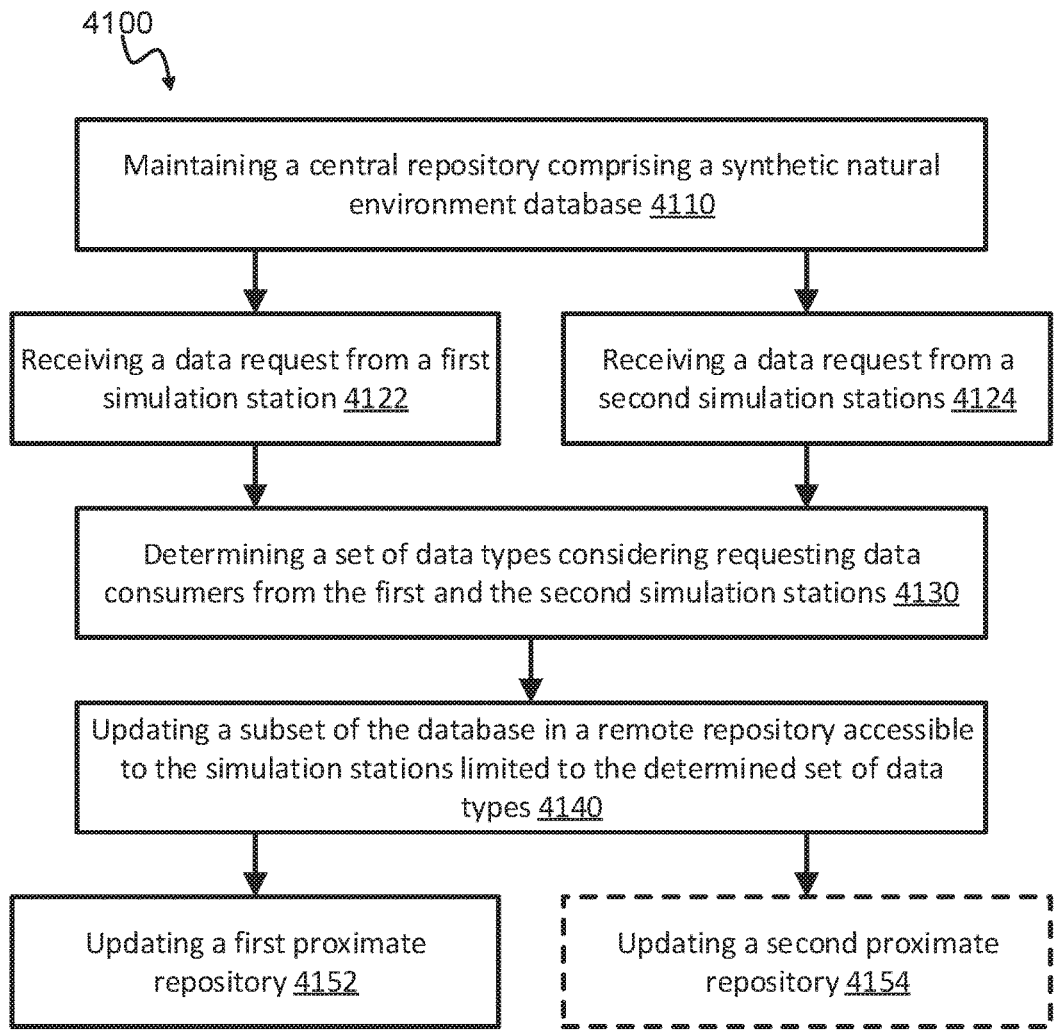

FIG. 2 provides a different logical view of the interactive computer simulation system 1000. The central repository 1500 of the distributed data storage system is depicted as being located at a storage facility 1800. The remote repository 1600 and the simulation stations 1200 are depicted as being co-located in a simulation facility 1900. The network 1840 is depicted as a Wide Access Network (WAN), which typically connect remote sites. The network 1940 is depicted as a Local Access Network (LAN), which typically connect systems at a single site. In comparison to the example of FIG. 1, the example of FIG. 2 shows the proximate repositories 1700 as being integrated in their respective simulation stations 1200. In the example of FIG. 2, the simulation station 1200.1 also comprises an internal network (LAN 1240) interconnecting different simulation data consumers 1280, 1282, 1284 thereof towards the proximate repository 1700.1. The simulation data consumers 1280, 1282 and 1284 are relevant in some of the different embodiments to be further described with particular reference to FIGS. 3A to 5B.

Skilled persons will readily recognize that an actual interactive computer simulation system 1000 likely comprises many simulation stations 1200 distributed over multiple simulation facilities (only 1900 shown). In the depicted example, the central repository 1500 contains all the synthetic natural environment database for the interactive computer simulation system 1000. The remote repository 1600 contains a subset of data stored at the central repository 1500 and each of the proximate repositories 1700 store a proximate subset of the data stored at the remote repository 1600. The synthetic natural environment database could be distributed over different repositories (not shown) in a manner transparent to the remote repository 1600 (i.e., single network address for the central repository 1500, distributed or not). Likewise, the subset stored at the remote repository 1600 could be distributed over different repositories (not shown) in a manner transparent to the proximate repositories 1700 or the simulation stations 1200 (i.e., single network address for the remote repository 1600, distributed or not). Similarly, when proximate repositories 1700 are provided, the proximate subsets stored at the proximate repositories 1700 may yet also be distributed over different repositories (not shown) in a manner transparent to the simulation stations 1200 (i.e., single network address for each of the proximate repositories 1700, distributed or not). The management functionalities of the remote data management system 1100 and/or central repository 1500 may also be distributed over different network nodes or provided by a distributed virtual computer system or cloud system.

As such, the central repository 1500 comprises the synthetic natural environment database that comprises data for representing a geographically-mapped computer generated environment of the interactive computer simulation, comprising at least geographically-located terrain skin representation. During the interactive computer simulation, the simulated vehicle moves within the computer generated environment considering, among other things, commands received from user through the tangible instrument module 1260.1. In order to correctly convey the status of the simulated system at the present location, the simulation station 1200.1 requires the relevant geographically-located data from the synthetic natural environment database. As the complete synthetic natural environment database is too large to be stored and managed locally at the simulation station 1200.1, the simulation station 1200.1 loads relevant data when needed. For instance, the simulation station 1200.1 would typically require data (imagery, elevation, vector data, 3D polygon meshes, etc.) to feed many different subsystems thereof (display system, simulated instrumentation, simulated collision avoidance system, simulated radar, simulated sonar, audible warnings system, line-of-sight determination system, etc.). Different algorithms have been developed for determining what data the simulation station 1200.1 should request data under different circumstances. However, as the synthetic natural environment database is stored remotely from the simulation station 1200.1, requesting the data incurs a first network delay for the request and a second network delay for the data. In addition, the network 1840 is typically a WAN that has more limited and/or more costly bandwidth. It would be beneficial to limit the number of exchanges and/or limit the amount of data exchanged thereover. It is therefore beneficial to increase the likelihood of getting the right data closer to the simulation station 1200.1, i.e., in the remote repository 1600 (and/or the proximate repository 1700.1), e.g., to avoid a request over the network 1840 and/or 1940 and/or to select when the data is sent over the network 1840 and/or 1940.

In accordance with a first set of embodiments particularly depicted with reference to FIG. 1, FIG. 2, FIG. 3A and FIG. 3B, the remote data management system 1100 is able to populate the remote repository 1600 with data that is expected to be accessed by the simulation stations 1200 (i.e., proactively pull data thereto). In order to do so, the remote data management system 1100 computes a plurality of expected geographical positions for a simulation station 1200.1 and anticipatorily updates the subset of the synthetic natural environment database stored in the remote repository 1600 with a supplemental subset of the synthetic natural environment database corresponding to one or more of the computed expected geographical positions.

In accordance with a second set of embodiments particularly depicted with reference to FIG. 1, FIG. 2, FIG. 4A and FIG. 4B, the remote data management system 1100 is able to populate the remote repository 1600 with data limited to a subset of data types required by simulation data consumers 1280, 1282, 1284 of the simulation stations 1200 (i.e., proactively filters data types therein). In order to do so, the remote data management system 1100 parses one or more data requests from a simulation station 1200.1 for one or more geographical locations and determines a set of data types considering one or more requesting data consumers 1280, 1282, 1284. The remote data management system 1100 then updates the subset of the synthetic natural environment database in the remote repository 1600 for the one or more geographical locations with data of only the set of data types.

In accordance with a third set of embodiments particularly depicted with reference to FIG. 1, FIG. 2, FIG. 5A and FIG. 5B, the remote data management system 1100 is able to manage remaining storage capacity of the remote repository 1600 by orderly removing extraneous data records therefrom (i.e., proactively cleans the remote repository 1600). In order to do so, the remote data management system 1100 monitors remaining storage capacity of the remote repository 1600. Upon reaching a high-level threshold value for the remaining storage capacity, the remote data management system 1100 removes a data record from the subset of data records stored in the remote repository 1600 until reaching a low-level threshold value for the remaining storage capacity. The most extraneous data record to be removed is identified considering one or more of a plurality of priority tags of the data records.

Reference is now made concurrently to FIG. 1, FIG. 2, FIG. 3A and FIG. 3B describing the first set of embodiments. A method 3000 is disclosed for supporting the interactive computer simulation system 1000 that executes an interactive computer simulation on the simulation station 1200.1. The simulation station 1200.1 allows one or more users to interact in the interactive computer simulation for controlling a simulated vehicle in a computer generated environment. The method 3000 comprises maintaining 3010, the central repository 1500 of the interactive computer simulation system 1000.

The method 3000 then comprises computing 3020 a plurality of expected geographical positions for the simulation station 1200.1 at a remote data management system 1100. Thereafter, from the remote data management system 1100, the method 3000 follows with anticipatorily updating 3050, via the network 1840/1940, a subset of the synthetic natural environment database stored in the remote repository 1600 accessible to the simulation station 1200.1 with a supplemental subset of the synthetic natural environment database corresponding to one or more of the computed expected geographical positions.

In some embodiments of the first set of embodiments, the method 3000 may further comprise monitoring 3040 remaining storage capacity of the remote repository 1600. In such an example, the supplemental subset may contain only data for geographical positions missing therefrom (i.e., circular motion of the simulated vehicle). The anticipatory update 3050 may also be performed until reaching 3040 a high-level remaining capacity threshold in the remote repository 1600.

In some embodiments of the method 3000, the synthetic natural environment database may further comprise navigation content related to more than one vehicles in the computer generated environment. Computing 3020 the plurality of expected geographical positions may then further comprise considering the navigation content from the perspective of the simulation station 1200.1.

In some embodiments of the first set of embodiments, the remote repository 1600 is accessible to multiple simulation stations 1200.1 . . . 1200.n. Computing 3020 the plurality of expected geographical positions is therefore performed for the simulation stations 1200.

A method 3100 is disclosed for supporting the interactive computer simulation system 1000 that executes an interactive computer simulation on the simulation stations 1200. The simulation stations 1200 each allow one or more users to interact in the interactive computer simulation for controlling one or more simulated vehicles in a single computer generated environment. The method 3100 comprises maintaining 3110 the central repository 1500 of the interactive computer simulation system 1000.

The method 3100 then comprises computing 3120 a plurality of expected geographical positions for the simulation stations 1200 at the remote data management system 1100. Thereafter, from the remote data management system 1100, the method 3100 follows with anticipatorily updating 3130, via the network 1840/1940, a subset of the synthetic natural environment database stored in the remote repository 1600 accessible to the simulation stations 1200 with a supplemental subset of the synthetic natural environment database corresponding to one or more of the computed expected geographical positions. In this example, computing 3120 the plurality of expected geographical positions is therefore performed for the simulation stations 1200.

In the exemplary method 3100, the proximate repository 1700.1 is accessible to the simulation station 1200.1, between the remote repository 1600 and the simulation station 1200.1. The proximate repository 1700.1 stores a proximate subset of the synthetic natural environment database smaller than the subset stored in the remote repository 1600. As mentioned with reference to other embodiments, the proximate repository 1700.1 may be dedicated to the simulation station 1200.1. The disclosed method 3100 further comprises, from the remote repository 1600, computing 3142 a plurality of proximate expected geographical positions for the simulation station 1200.1 and anticipatorily updating 3152 the proximate subset with a supplemental proximate subset of the synthetic natural environment database corresponding to one or more of the computed proximate expected geographical positions. While it is not mandatory, in typical embodiments, each of the simulation stations 1200 is associated with or provided with one of the proximate repositories 1700. The remote repository 1600 or the proximate repository 1700.1 . . . 1700.n, itself, would then compute 3144 expected positions and update 3154 the relevant one(s) of the proximate repositories 1700.

In the context of the exemplary method 3100, each of the simulation stations 1200 may execute a local interactive computer simulation application that strictly accesses their respective proximate repositories 1700 for obtaining geographically-located data (e.g., for displaying images) in relation to the computer generated environment of the interactive computer simulation (or a single point of contact therefor). Likewise, the proximate repositories 1700 may strictly access the remote repository 1600 (or a single point of contact therefor) and the remote repository 1600 may strictly access the central repository 1500 (or a single point of contact therefor).

In some embodiments of the first set of embodiments, the method 3100 may further comprise monitoring (not shown) remaining storage capacity of the remote repository 1600 and/or in the proximate repositories 1700. In such an example, the supplemental subset and/or the supplemental proximate subset may contain only data for geographical positions missing therefrom (i.e., circular motion of the simulated vehicle). The anticipatory update 3130, 3152 and/or 3154 may then be performed until reaching a high-level remaining capacity threshold thereof.

Reference is now made concurrently to FIG. 1, FIG. 2, FIG. 4A and FIG. 4B describing the second set of embodiments. A method 4000 is disclosed for supporting the interactive computer simulation system 1000 that executes an interactive computer simulation on the simulation station 1200.1. The simulation station 1200.1 allows one or more users to interact in the interactive computer simulation for controlling a simulated vehicle in the computer generated environment. The method 4000 comprises maintaining 4010 the central repository 1500 of the interactive computer simulation system 1000. The synthetic natural environment database comprises data of a plurality of data types for representing a plurality of geographically-located elements (e.g., at least terrain skin representation, but also typically 3D polygon meshes, vector data and metadata) of the computer generated environment of the interactive computer simulation. The method 4100 comprises receiving 4020, over the network 1840/1940, a data request issued from the simulation station 1200.1 for one or more geographical locations. In the second sets of embodiments, the simulation station 1200.1 comprises the plurality of data consumers 1280, 1282, 1284 each requiring data from one or more of the plurality of data types. In typical embodiments, each of the data consumers 1280, 1282 and 1284 perform their own data requests. In some other embodiments, the data request aggregates the data types from the requesting data consumers 1280, 1282, 1284 for the geographical location(s) and a single data request is therefor sent.

The method 4000 comprises determining 4030 a set of data types considering one or more requesting data consumers from the plurality of data consumers 1280, 1282, 1284. This may be performed by analyzing the data request(s) and determine a type of data consumer from an identifier therein. The data consumers 1280, 1282 and 1284 may also register their required data types in the first data request or in advance of the first data request. The registration could be based on an identifier or an address of data consumers 1280, 1282 and 1284.

The method 4000 then comprises updating 4040, over the network 1840/1940, a subset of the synthetic natural environment database stored in the remote repository 1600 for the one or more geographical locations with data of only the set of data types.

For instance, the plurality of data types may comprise rendering-faces data, surface-texture data and reflectivity data. Examples of the data consumers 1280, 1282 and 1284 may include a radar system requiring rendering faces data and reflectivity data and a visual display system requiring rendering faces data and surface texture data. Other examples of the data consumers 1280, 1282 and 1284 that may require different data types include sonar (acoustic) sub-system, collision avoidance sub-system, infrared sensors sub-system, night vision goggles sub-system, electro-optical sub-system, computer generated forces sub-system (e.g., other elements that act within the simulated system), mission functions sub-system (e.g., own-ship environment data), navigation sub-system, etc.

Determining 4030 the set of data types may be performed by a logical union operation of required data types from the one or more requesting data consumers 1280, 1282, 1284 (e.g. from different requests for the same location(s) aggregated in a single data push or within the single data request). When the method 3000 and/or 3100 is used together with the method 4000, it is also helpful to consider data for expected locations for all of the relevant data types. For instance, the method 4000 may further comprise computing (not shown) a plurality of expected geographical positions for the simulation station 1200.1 and monitoring (not shown) remaining storage capacity of the remote repository 1600. Updating 4040 the subset may therefore be performed for one or more of the expected geographical positions until reaching a high-level remaining capacity threshold.

The synthetic natural environment database may further comprise navigation content related to more than one vehicles in the computer generated environment wherein determining 4030 the set of data types may then be performed considering the navigation content from the perspective of the interactive computer simulation stations 1200.

Updating 4040 the subset at the remote repository 1600 may also be performed considering priority tags associated therewith.

A method 4100 is disclosed for supporting the interactive computer simulation system 1000 that executes an interactive computer simulation on the simulation stations. Each of the simulation stations allows one or more users to interact in the interactive computer simulation for controlling one or more simulated vehicle in the computer generated environment. The method 4100 comprises maintaining 4110 the central repository 1500 of the interactive computer simulation system 1000. The synthetic natural environment database comprises data of a plurality of data types for representing a plurality of geographically-located data, as exemplified previously, of the computer generated environment of the interactive computer simulation. The method 4100 comprises receiving 4122, 4124, over the network 1840/1940, data requests issued from more than one of the simulation stations 1200 for one or more geographical locations. In the second sets of embodiments, the simulation stations 1200 each comprise the plurality of data consumers 1280, 1282, 1284 each requiring data from one or more of the plurality of data types. In typical embodiments, each of the data consumers 1280, 1282 and 1284 perform their own data requests. In some other embodiments, the data request aggregates the data types from the requesting data consumers for the geographical location(s) and a single data request is therefor sent.

The method 4100 comprises determining 4130 a set of data types considering one or more requesting data consumers 1280, 1282, 1284 from the plurality of data consumers. This may be performed by analyzing the received data requests 4122, 4124 together or, more typically, by performing the determination 4130 for each of the received data requests 4122, 4124. The determination 4130 may be based on a type of data consumer from an identifier in the data request 4122, 4124. The data consumers 1280, 1282 and 1284 may also register their required data types in the first data request or in advance of the first data request. The registration could be based on an identifier or an address of data consumers 1280, 1282 and 1284.

The method 4100 then comprises updating 4140, over the network 1840/1940, a subset of the synthetic natural environment database stored in the remote repository 1600 for the one or more geographical locations with data of only the set of data types. For instance, the plurality of data types may comprise rendering-faces data, surface-texture data and reflectivity data. Examples of the data consumers 1280, 1282 and 1284 may include a radar system requiring rendering faces data and reflectivity data and a visual display system requiring rendering faces data and surface texture data. Other examples were also previously provided.

Determining 4130 the set of data types may be performed by a logical union operation of required data types from the one or more requesting data consumers (e.g. from different requests for the same location(s) aggregated in a single data push or within the single data request). When the method 3000 and/or 3100 is used together with the method 4100, it is also helpful to consider data for expected locations for all of the relevant data types. For instance, the method 4100 may further comprise computing (not shown) a plurality of expected geographical positions for the simulation station 1200.1 and monitoring (not shown) remaining storage capacity of the remote repository 1600. Updating 4140 the subset may therefore be performed for one or more of the expected geographical positions until reaching a high-level remaining capacity threshold.

In the exemplary method 4100, the proximate repository 1700.1 is accessible to the simulation station 1200.1, between the remote repository 1600 and the simulation station 1200.1. The proximate repository 1700.1 stores a proximate subset of the synthetic natural environment database smaller than the subset stored in the remote repository 1600. As mentioned with reference to other embodiments, the proximate repository 1700.1 may be dedicated to the simulation station 1200.1. The disclosed method 4100 further comprises, updating 4152 the proximate subset with a supplemental proximate subset of the synthetic natural environment database with data of only relevant data types. While it is not mandatory, in typical embodiments, each of the simulation stations 1200 is associated with or provided with one of the proximate repositories 1700. The remote repository 1600 or the proximate repository itself would then determine the set of data types 4140 accordingly and update 4154 the relevant one(s) of the proximate repositories 1700.

In the context of the exemplary method 4100, each of the simulation stations 1200 may execute a local interactive computer simulation application that strictly accesses their respective proximate repositories 1700 for accessing relevant geographically-located data (e.g., for displaying images) in relation to the computer generated environment of the interactive computer simulation (or a single point of contact therefor). Likewise, the proximate repositories 1700 may strictly access the remote repository 1600 (or a single point of contact therefor) and the remote repository 1600 may strictly access the central repository 1500 (or a single point of contact therefor).

In some embodiments of the second set of embodiments, the method 4100 may further comprise monitoring (not shown) remaining storage capacity of the remote repository 1600 and/or of the proximate repositories 1700. In such an example, the supplemental subset and/or the supplemental proximate subset may contain only data for data types missing therefrom (e.g., reflectivity data already present, but texture data missing as the radar system reaches farther compared to the visual display system). The update 4140, 4152 and/or 4154 may then be performed until reaching a high-level remaining capacity threshold thereof.

Reference is now made concurrently to FIG. 1, FIG. 2, FIG. 5A and FIG. 5B describing the third set of embodiments. A method 5000 is disclosed for supporting the interactive computer simulation system 1000 that executes an interactive computer simulation on the simulation station 1200.1. The simulation station 1200.1 allows one or more users to interact in the interactive computer simulation for controlling a simulated vehicle in a computer generated environment. The method 5000 comprises maintaining 5010 the central repository of the interactive computer simulation system 1000. In this third set of embodiments, the synthetic natural environment database comprises a plurality of data records for representing the plurality of geographically-located data (e.g. as better exemplified earlier, terrain skin, polygon meshes, etc.) of the computer generated environment. The remote repository 1600 accessible through the network 1840/1940 stores a subset of data records from the synthetic natural environment database and one of a plurality of priority tags is associated with each one of the subset of data records.

The method 5000 comprises monitoring 5020 remaining storage capacity of the remote repository 1600 and, upon reaching a high-level threshold value 5030 for the remaining storage capacity, removing 5040 the most extraneous data record from the remote repository 1600. The most extraneous data record is identified considering one or more of the plurality of priority tags, from the subset of data records stored in the remote repository 1600. The removal 5040 is performed until reaching 5050 a low-level threshold value for the remaining storage capacity.

In some embodiments, identifying the most extraneous data record for removal 5040 may comprise sorting the subset of data records in the remote repository 1600 to obtain a priority-ordered target list such that a top data record therefrom represents the most extraneous data record for removal 5040. Removing 5040 the most extraneous data record is therefore performed by removing 5040 the top data record from the target list until reaching 5050 a low-level threshold value for the remaining storage capacity.

Figure 5A:
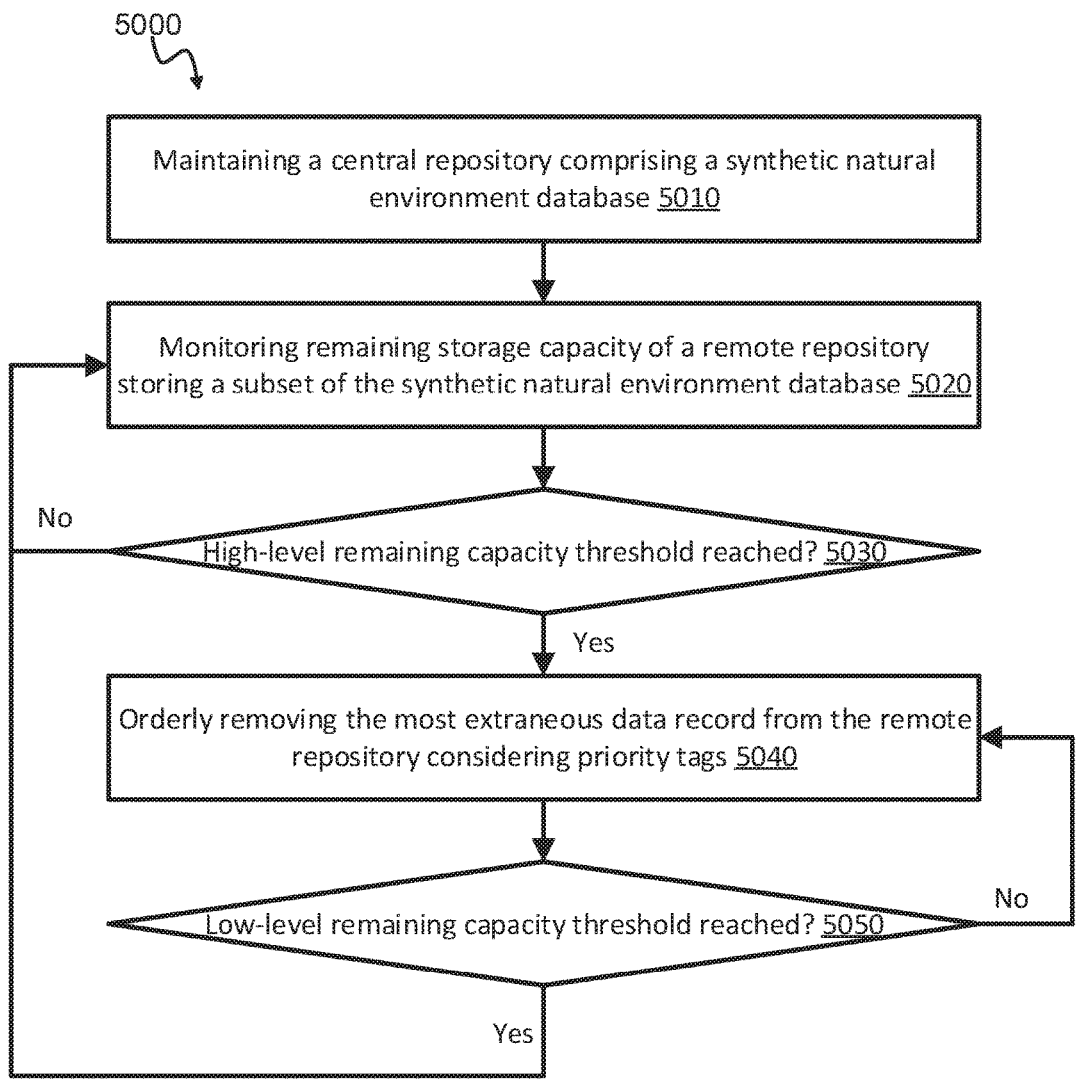
Figure 5B:
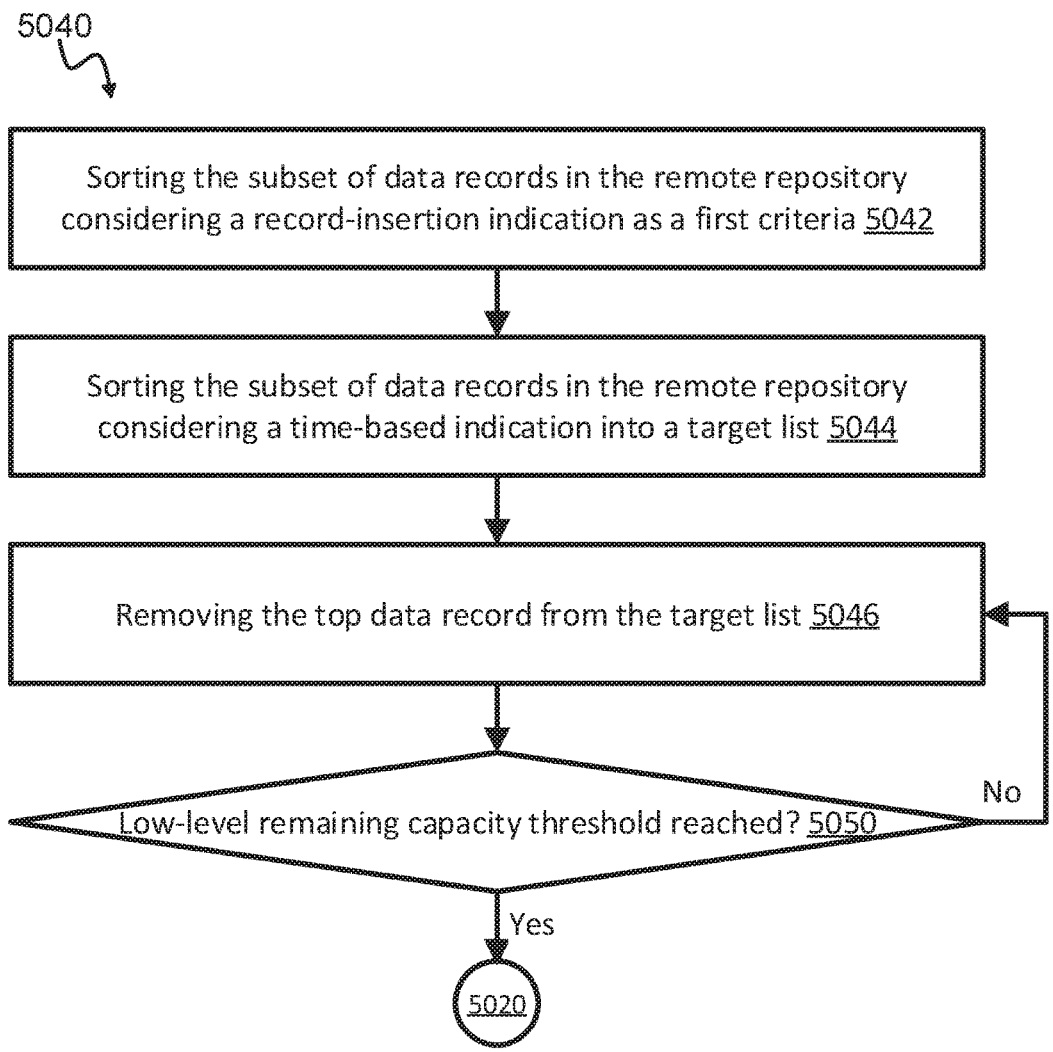

In some embodiments, each one of the plurality of priority tags comprises a time-based indication for obtaining a corresponding relative record age and a record-insertion-method indication. As exemplified in FIG. 5B showing a specific example of the removal 5040, the target list may first be sorted 5042 by considering the record-insertion-method indication before being further sorted 5044 by considering the time-based indication. The removal 5040 is therefore performed by removing 5046 the top data record from the target list until reaching 5050 a low-level threshold value for the remaining storage capacity.

For instance, the record-insertion-method indication may be one of "explicitly requested from simulation" (e.g., requested by one or more of the simulation stations 1200) and "predicted by repository" (e.g., predicted using the method 3000 and/or 3100). The target list may thus be ordered for all the "predicted" records at the top followed by all the "requested" records by age with the oldest towards the top. In this example, the "predicted" records are all removed before the "requested" records. The "predicted by repository" indication may further be expanded into "geographical prediction", "sub-data-type" and "best-guess". Where the geographical prediction is considered of higher priority than sub-data-type, which is itself of higher priority than best-guess. The priority tags may further comprise a "number of requestors" indication considered before the time-based indication for ordering the target list.

The method 5000 may also be performed when one or more of the proximate repositories 1700 are provided. The method 5000 may thus be performed hierarchically from the remote repository 1600 towards one or more of the proximate repositories 1700.

A method is generally conceived to be a self-consistent sequence of steps leading to a desired result. These steps require physical manipulations of physical quantities. Usually, though not necessarily, these quantities take the form of electrical or magnetic/electromagnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities. The description of the present invention has been presented for purposes of illustration but is not intended to be exhaustive or limited to the disclosed embodiments. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

What is claimed is:

1. A remote data management system for supporting an interactive computer simulation system that executes an interactive computer simulation, comprising:
    a network interface module providing network access towards a central repository for storing a synthetic natural environment database that comprises data of a plurality of data types for a plurality of geographically-located terrain skin representations of a computer generated environment of the interactive computer simulation and towards an interactive computer simulation station participating in the interactive computer simulation, the interactive computer simulation station allowing one or more users to interact in the interactive computer simulation for controlling a vehicle in the computer generated environment, wherein the interactive computer simulation station comprising a plurality of data consumers each requiring data from one or more of the plurality of data types;
    a data storage system comprising a remote repository for storing a subset of the synthetic natural environment database; and
    a processor module that:
        upon receipt of a data request from the interactive computer simulation station for one or more geographical locations, determines a set of data types considering one or more requesting data consumers from the plurality of data consumers;
        updates the subset of the synthetic natural environment database in the remote repository for the one or more geographical locations with data of only the set of data types;
        computes a plurality of expected geographical positions for the interactive computer simulation station; and
        monitors remaining storage capacity of the remote repository, wherein the processor module updates the subset of the synthetic natural environment database for one or more of the expected geographical positions until reaching a high-level remaining capacity threshold.

2. The remote data management system of claim 1, wherein the plurality of data types comprise rendering-faces data, surface-texture data and reflectivity data.

3. The remote data management system of claim 2, wherein the plurality of data consumers comprise a radar system requiring rendering faces data and reflectivity data and a visual display system requiring rendering faces data and surface texture data.

4. The remote data management system of claim 1, wherein the set of data types is determined by a logical union operation of required data types from the one or more requesting data consumers.

5. The remote data management system of claim 1, wherein the synthetic natural environment database further comprises navigation content related to more than one vehicles in the computer generated environment, the processor module determines the set of data types considering the navigation content from the perspective of the interactive computer simulation station.

6. The remote data management system of claim 1, wherein the processor module updates the subset of the synthetic natural environment database at the remote repository considering priority tags associated therewith.

7. A method for supporting an interactive computer simulation system that executes an interactive computer simulation, comprising:
    providing access towards a central repository that stores a synthetic natural environment database that comprises data of a plurality of data types for a plurality of geographically-located terrain skin representations of a computer generated environment of the interactive computer simulation;
    receiving, over a network, a data request issued from an interactive computer simulation station for one or more geographical locations, the interactive computer simulation station allowing one or more users to interact in the interactive computer simulation for controlling a vehicle in the computer generated environment, wherein the interactive computer simulation station comprises a plurality of data consumers each requiring data from one or more of the plurality of data types;
    determining a set of data types considering one or more requesting data consumers from the plurality of data consumers;
    updating, over the network, a subset of the synthetic natural environment database stored in a remote repository for the one or more geographical locations with data of only the set of data types, the remote repository being accessible to the interactive computer simulation station;
    computing a plurality of expected geographical positions for the interactive computer simulation station; and
    monitoring remaining storage capacity of the remote repository, wherein updating the subset of the synthetic natural environment database is performed for one or more of the expected geographical positions until reaching a high-level remaining capacity threshold.

8. The method of claim 7, wherein the plurality of data types comprise rendering-faces data, surface-texture data and reflectivity data.

9. The method of claim 8, wherein the plurality of data consumers comprise a radar system requiring rendering faces data and reflectivity data and a visual display system requiring rendering faces data and surface texture data.

10. The method of claim 7, wherein determining the set of data types is performed by a logical union operation of required data types from the one or more requesting data consumers.

11. The method of claim 7, wherein the synthetic natural environment database further comprises navigation content related to more than one vehicles in the computer generated environment and wherein determining the set of data types is performed considering the navigation content from the perspective of the interactive computer simulation station.

12. The method of claim 7, wherein updating the subset of the synthetic natural environment database at the remote repository is performed considering priority tags associated therewith.

13. A system, for executing an interactive computer simulation of a simulated vehicle, comprising a remote data management system, a central repository, a remote repository and an interactive computer simulation station interconnected via a network, wherein:
the central repository comprises a synthetic natural environment database that comprises data of a plurality of data types for a plurality of geographically-located terrain skin representations of a computer generated environment of the interactive computer simulation;
the remote data management system of the interactive computer simulation system maintain the remote repository storing a subset of the synthetic natural environment database;
the interactive computer simulation station:
comprises a plurality of data consumers each requiring data from one or more of the plurality of data types;
sends, over the network, a data request for one or more geographical locations from the synthetic natural environment database for rendering images for the interactive computer simulation; and
allows one or more users to interact in the interactive computer simulation for controlling the simulated vehicle in the computer generated environment considering the rendered images; and
the remote data management system of the interactive computer simulation system:
determines a set of data types considering one or more requesting data consumers from the data request;
updates, over the network, the subset of the synthetic natural environment database stored in the remote repository for the one or more geographical locations with data of only the set of data types;
computes a plurality of expected geographical positions for the interactive computer simulation station; and
monitors remaining storage capacity of the remote repository, wherein the remote data management system updates the subset of the synthetic natural environment database for one or more of the expected geographical positions until reaching a high-level remaining capacity threshold.

14. The system of claim 13, further comprising a second interactive computer simulation station having access to the remote repository via the network, wherein the remote data management system determines the set of data types considering one or more requesting data consumers from the plurality of data consumers and one or more second requesting data consumers from a second plurality of data consumers of the second interactive computer simulation station.

15. The system of claim 14, further comprising a proximate repository, between the remote repository and the interactive computer simulation station dedicated thereto, accessible to the remote repository for storing a proximate subset of the synthetic natural environment database smaller than the subset stored in the remote repository, wherein the remote repository further:
determines a set of proximate data types considering one or more requesting data consumers from the plurality of data consumers; and
remotely updates, over the network, the proximate subset of the synthetic natural environment database stored in the proximate repository for the one or more geographical locations with data of only the set of data types.

16. The system of claim 15, further comprising a second proximate repository, between the remote repository and the second interactive computer simulation station dedicated thereto, accessible to the remote repository for storing a second proximate subset of the synthetic natural environment database smaller than the subset stored in the remote repository, wherein the remote repository further:
determines a second set of proximate data types considering the one or more second requesting data consumers from the second plurality of data consumers; and
remotely updates, over the network, the second proximate subset of the synthetic natural environment database stored in the second proximate repository for the one or more geographical locations with data of only the second set of data types.

17. The system of claim 16, wherein the proximate repository and the second proximate repository strictly access the remote repository via the network for respectively complementing the proximate subset and the second proximate subset and the remote repository strictly accesses the central repository for complementing the subset.

* * * * *